July 10, 1962 R. H. NORMAN 3,043,966
NONSATURATING BILEVEL TRANSISTOR AMPLIFIER HAVING, IN COMMON PORTION OF INPUT CIRCUIT AND NEGATIVE FEEDBACK CIRCUIT, A DIODE
Filed Feb. 19, 1959
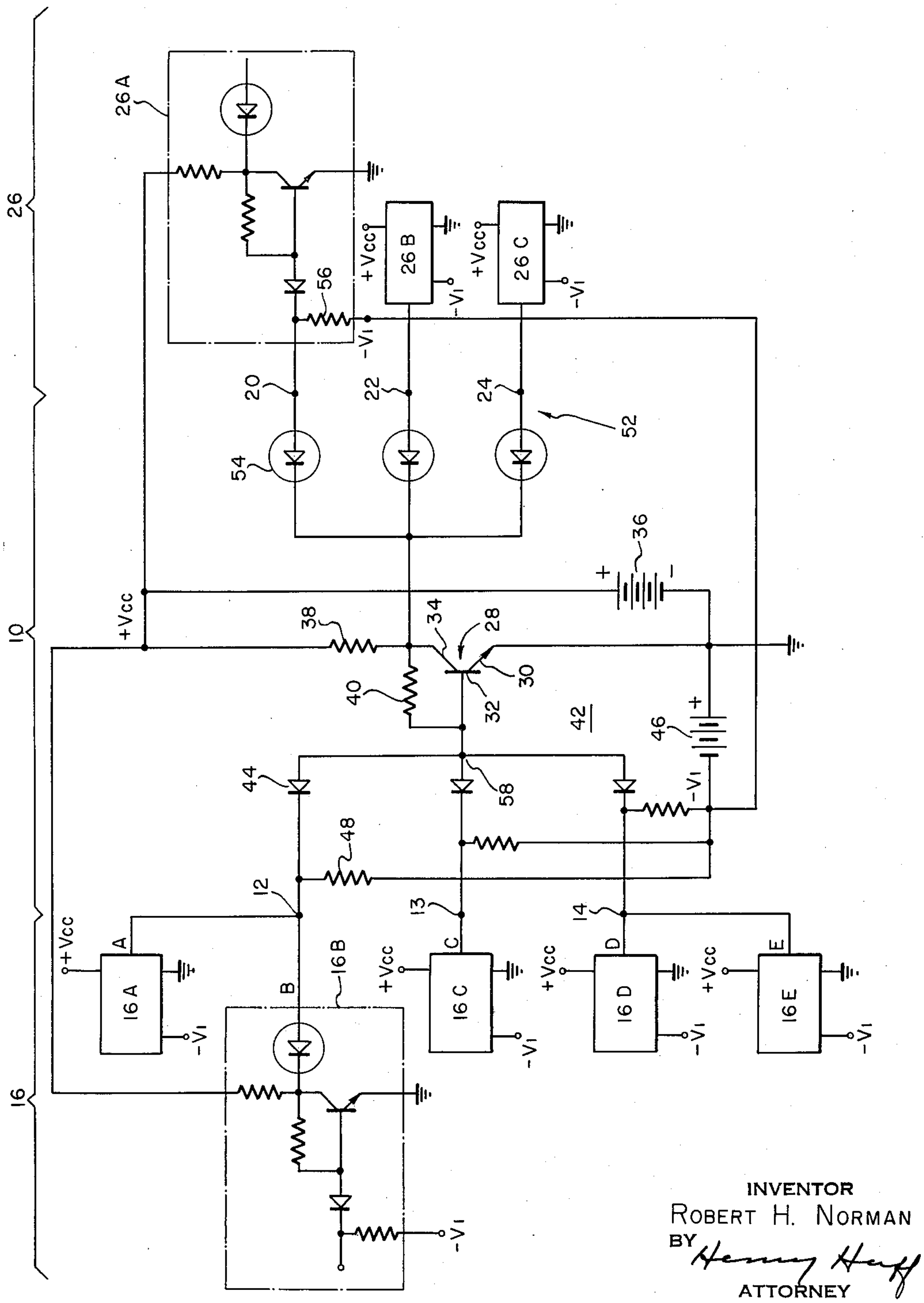
INVENTOR
ROBERT H. NORMAN
BY Henry Huff
ATTORNEY United States Patent Office 3,043,966
Patented July 10, 1962

3,043,966

NONSATURATING BILEVEL TRANSISTOR AMPLIFIER HAVING, IN COMMON PORTION OF INPUT CIRCUIT AND NEGATIVE FEEDBACK CIRCUIT, A DIODE

Robert H. Norman, Glen Oaks, N.Y., assignor to Sperry Rand Corporation, Great Neck, N.Y., a corporation of Delaware Filed Feb. 19, 1959, Ser. No. 794,336
2 Claims. (Cl. 307—88.5)

This invention relates to switching circuits and more particularly to a basic building block binary logic package.

Because of the multiplicity of circuits in digital computers for performing the requisite great number of similar and different logic operations and storage functions on data by the computer, it is most desirable to employ modular techniques using a basic digital logic package as a building block. While the use of breakdown diodes in connection with electron discharge devices in switching circuits has been heretofore proposed, these circuits have been slow and unadaptable as basic building blocks for performaing all of the necessary functions in a digital system. In such previously proposed circuits, increases of speed, if any, could only be marginal even if the discharge devices, for example transistors, would be clamp-biased in an effort to avoid saturation and the resulting storage effects which cause switching inertia. Such a clamp would begin to draw collector current after it is turned on and may draw sufficient current to saturate the transistor. When it is turned off, the current through the clamp must be returned to zero before the collector voltage can begin to rise. This takes a finite time, necessarily slowing down the operation of the circuit.

Previous circuits of this type have also been restricted with regard to the number of inputs which they could handle.

The present invention contemplates an all-purpose, high-speed, basic digital logic package which will perform all the necessary functions in a digital system, and, therefore be suitable as a basic building block.

The above advantages are realized in accordance with one embodiment of the invention in a circuit combination wherein an electron discharge device, for instance a transistor, having a breakdown diode load circuit connected to its output, is supplied with bias by a self-degenerating feedback network which limits the bias to avoid operation in the saturation region and which, in response to a control circuit responsive to binary input signals that are substantially blocked from the transistor input, biases the transistor either to a conductive state or to a less conductive state, preferably cut-off, depending on the value of the input signal, the output voltages of the transistor during the conductive and less conductive states being respectively below and above the breakdown voltage of the breakdown diode and always above the saturation voltage.

It is therefore an object of the present invention to provide a high speed switching circuit.

Another object is to provide a high speed switching circuit that can accept any number of inputs.

Another object is to provide a high speed modular digital logic package.

Another object of the present invention is to provide a high speed transistorized modular digital logic package.

Further objects and advantages of the present invention will be apparent from the following description, reference being had to the accompanying drawing wherein the single FIGURE diagrammatically illustrates a preferred embodiment of the invention.

As seen in the drawing, a logic package 10 has its input terminals 12, 13 and 14, connected to the outputs of five other logic elements 16, (some only partly shown) and its output terminals 20, 22 and 24, connected to supply three other logic elements 26 (partly shown). The package 10 includes an electron discharge device, for example an NPN transistor 28 having emitter, base, and collector electrodes 30, 32 and 34, respectively. Power is supplied to the transistor 28 by a battery 36 connected across the collector electrode 34 and emitter electrode 30 through a collector resistor 38. The emitter electrode is grounded. A resistor 40 connected between the collector 34 and base 32 supplies "self-bias" current to the base electrode in a direction to render the transistor conductive. The resistor 40 being connected to the collector, the current therethrough is dependent on the collector voltage which in turn varies with the transistor impedance. As the current conduction of the transistor decreases, the impedance and consequently the collector voltage increase. When transistor conduction increases, the impedance decreases, and therefore the collector voltage decreases. Thus, the current supplied to the base through the resistor 40 is negative feedback, and since it depends on the transistor impedance it is self-degenerative feedback, that is, the transistor itself generates and controls the feedback. The value of the resistor 40 is chosen to bias the transistor into a state of relatively high conduction in the active region, and to limit the feedback bias current to prevent operation of the transistor in the saturation region, that is, to prevent the collector voltage from dropping to the saturation value.

An input control circuit 42 connected to the base electrode 32, either allows the feedback current from the resistor 40 to flow into the base electrode 32 thereby biasing the transistor for high conduction or it diverts the feedback current away from the base electrode, thereby biasing the transistor to a relatively low state of conduction such as cutoff, depending on which of dual value input signals is present at each of the input terminals of the input circuit. Connected between each input terminal and the base electrode 32 is a diode which is poled oppositely to the emitter-base junction of the transistor 28. For example, a diode 44 connected between the input terminal 12 and the base electrode 32 is oppositely related to the emitter base junction. Because of their orientation, the input diodes block the input signals from the base electrode, i.e., they prevent the signals received at the input terminal from reaching the base electrode, and thus avoid possible saturation due to input signal current. Each of the input terminals is connected through an impedance to the negative side of a battery 46 whose positive side is connected to ground.

For instance, terminal 12 is connected to battery 46 through a resistor 48.

If any one of the input terminals sees a high impedance, for example, as a result of either negative or no input voltage, the diode connected thereto will be forward biased by the battery 46. For instance, if input terminal 12 sees a high impedance, diode 44 will be forward biased and feedback current will flow from the battery 36 through resistors 38 and 40, the diode 44, resistor 48 and battery 46 to the negative side of battery 36, thus diverting sufficient feedback current away from the base electrode 32 and through the current path including the resistor 48 to reduce the forward bias of the emitter-base junction and render the transistor less conductive, preferably cut off, thereby raising the collector voltage to a high positive value. Preferably enough feedback current is diverted through the resistor 48 to provide a base electrode potential at which the emitter-base junction of the transistor is reverse-biased and the transistor is cut off, i.e., in the extreme "less conductive" state. If in addition another one or both of the remaining input terminals see a high impedance, additional paths will be provided from the resistor 40 through the other input diodes to the negative side of the battery 46, thus, diverting more of the feedback current away from the base electrode 32 and lowering the base voltage even more. On the other hand, if a sufficiently high positive voltage is present at all of the inputs to back bias the input diodes that are connected between the input terminals and the base electrode 32, all the current flowing through the feedback resistor 40 will flow into the base electrode, thus biasing the transistor to a high state of conduction in the active region, and the collector voltage will decrease to a value determined by the amount of feedback applied to the base electrode. Although the input signals are sufficiently blocked from the base electrode to avoid saturation due to signal current, the turn-off time of the input diodes allows current to flow from the input into the transistor base for a short interval thus speeding up the turn-on of the transistor. Albeit the package is shown connected to receive five input signals, there is no restriction on the number of input diodes and the package will accept any number of inputs. The collector voltage is chosen by the proper relation of circuit parameters to avoid operating the transistor in the saturation region.

A plurality of parallel connected load circuits 52 are connected across the output circuit of transistor 28 by means of connections to the collector electrode 34 and the emitter electrode 32 through battery 46. Each load circuit includes in series a breakdown diode and a resistor. The breakdown diodes are non-conductive below their breakdown voltage and conductive above their breakdown voltage with respect to the polarity of the load circuit. For example, one of the parallel load circuits includes breakdown diode 54 and the resistor 56 connected in series therewith. The breakdown diodes may for example be Zener diodes which are connected in the reverse direction with respect to the transistor collector voltages. The relative values of the circuit components are arranged so that when transistor 28 is in the aforesaid less conductive or cut off condition due to the presence of a high impedance at one or more of the input terminals 12, 13 or 14, the collector voltage will be higher than the breakdown voltage of the breakdown diodes 54, and when the transistor 28 is in the relatively high conductive state due to the presence of a positive signal at all the input terminals the collector voltage will be below the breakdown voltage of the breakdown diodes although it is arranged to be above the saturation voltage. When the collector voltage is above the aforesaid breakdown voltage the breakdown diodes in the load circuit will of course be broken down and will conduct in the reverse direction to provide a positive output signal at the respective output terminals 20, 22 and 24 which are connected to supply the separate logic elements 26 in the system. With the collector voltage below their breakdown voltage, the breakdown diodes do not conduct and the signal at the respective output terminals is a high impedance or negative signal which is seen by the inputs of the respective logic elements 26. Never being forward biased, the Zener diodes are not subject to storage slow down and there is no turn-off time.

The respective input terminals 12, 13 and 14 of the logic package 10 are shown as connected to the respective outputs of five other logic packages 16, more specifically indicated as 16A, 16B, 16C, 16D and 16E, each being of the same general nature as the package 10, having the same basic components and operable in the same manner. In the particular example shown, the input resistors 48 of the logic package 10 are loads on the preceding logic packages 16. The same situation occurs at the output of the logic package 10, wherein the resistors 56 connected to the output are the input resistors for the following logic elements 26, individually indicated as 26A, 26B and 26C, and each of which is of the same general nature as the package 10, having the same basic components operable in the same manner.

To explain the operation of the disclosed apparatus as a digital logic package for the performance of various binary logic functions, it is necessary to define the "1" and "0" states in terms of the state of one of the elements in the circuit. In the following explanation the "0" state is defined as the conducting condition of the breakdown diode and the "1" state is defined as the cut off condition of the breakdown diode. If input terminal 12 sees a high impedance then all the breakdown diodes connected to it must be in the cut off or the "1" state. This is the logical product or AND function, and the Boolean function at terminal 12 for this condition is AB. When any of the input terminals 12, 13 or 14 are in the "1" state, that is, all Zener diodes to that input terminal are cut off, then the point 58 will see a conducting diode and it too will be in the "1" state. This is the logical sum or the OR function. Thus, the Boolean function for this condition at point 58 is AB+C+DE. Since the transistor circuit is of the grounded emitter configuration, its output is the inverse of its input and the function at each of the output terminals 20, 22 and 24, is the NOT of the function at point 58, the input to the transistor. Thus all necessary logic functions are performed by this circuit.

While the transistor shown by way of example is an NPN type, the circuit will function in an analogous manner with a PNP transistor if the polarities of the voltages and diodes are reversed.

In a particular example which was designed to supply five other logic packages through five outputs, components with the following assigned values were employed in the logic package:

| | |
|---|---|
| Transistor 28 | 904A (by Texas Instruments)—Silicon. |
| Input diodes 44 | 1N251 (by Transitron)—Silicon. |
| Breakdown diodes 54 | 1N201 (by National Siliconductor)—Silicon—Breakdown (Zener) voltage 10 v.±5%. |
| Resistor 38 | 3480 ohms. |
| Resistor 40 | 23700 ohms. |
| Resistors 48 and 56 | 8250 ohms. |
| $+V_{cc}$ | +30 v. |
| $-V_1$ | −6 v. |

This logic package has a .125 μsec. response at room temperature, and a .5 μsec. response within a temperature range of −50° C. to +120° C. The response time is the delay time of information through the package.

In the illustrated example the dual-valued input signals to the input terminals of the package 10 are either a positive voltage or a high impedance depending on the binary digit represented. However, it should be appreciated that the package may respond to input signals having two different voltage values, provided that the input diode is biased in response to a signal of one value to control the feedback in a manner to bias the transistor to high conduction in the active region, and provided further that in response to a signal of the other value the input diode is biased to control the feedback in a way to bias the transistor to a less-conductive state, for instance cut-off, the collector voltages in the respective high and low states of conduction being respectively below and above the reverse breakdown voltage of the output breakdown diodes, and the amount of feedback to the transistor input being limited to keep the collector voltage above saturation voltage.

While the form of the embodiment of the invention as herein disclosed constitutes a preferred form, it is to be understood that other forms might be adopted, all coming within the scope of the claims which follow.

What is claimed is:

1. A digital logic package responsive to dual-valued signals comprising a common emitter transistor circuit including a transistor having respective emitter, base and collector electrodes, a point of common reference to which the emitter electrode is coupled, a degenerative feedback network including a resistor connected between the base and collector electrodes for supplying to the base electrode a feedback which is variable in response to changes of the transistor output and is limited to avoid operation of the transistor in the saturation region, an input terminal for receiving dual-valued input signals, a diode connected in series circuit between the input terminal and the base electrode, said diode being oppositely poled with respect to the emitter base junction of the transistor, a current path connected from said terminal to the point of common reference whereby said feedback is divided between said current path and the base electrode, means including said current path for back-biasing said diode in response to one of said dual-valued input signals, and for forward-biasing the diode in response to the other of said input signals, whereby first and second different ratios of said feedback division are provided when said diode is back-biased and forward-biased respectively, said transistor being operable in a first state in response to said first ratio of feedback and in a second state in response to said second ratio of feedback, an output circuit including in series a breakdown diode and a resistor connected across said collector and emitter electrodes for subjecting the latter diode to a collector voltage which is above the breakdown voltage of the breakdown diode in response to one of said transistor states of operation and to a collector voltage below said breakdown voltage in response to the other state of operation of the transistor, the respective collector voltages associated with said states of operation being above the saturation voltage of the transistor.

2. A digital logic package responsive to dual-valued signals comprising a common emitter transistor circuit including a transistor having respective emitter, base and collector electrodes, a point of common reference to which the emitter electrode is coupled, a degenerative feedback network including a resistor connected between the base and collector electrodes for supplying to the base electrode a feedback which is variable in response to changes of the transistor output and is limited to avoid operation of the transistor in the saturation region, an input terminal for receiving dual-valued input signals, a diode connected in series circuit between the input terminal and the base electrode, said diode being oppositely poled with respect to the emitter-base junction of the transistor, a current path connected from said terminal to the point of common reference whereby said feedback is divided between said current path and the base electrode, means including said current path for back-biasing said diode in response to one of said dual-valued input signals, and for forward-biasing the diode in response to the other of said input signals, whereby first and second different ratios of said feedback division are provided when said diode is back-biased and forward-biased respectively, said transistor being operable in a first state in response to said first ratio of feedback and in a second state in response to said second ratio of feedback, an output circuit coupled to said collector and subject to the collector voltages which in said respective states of operation respectively represent said dual values, the respective collector voltages associated with said states of operation being above the saturation voltage of the transistor.

References Cited in the file of this patent

UNITED STATES PATENTS

| | | |
|---|---|---|
| 2,581,456 | Swift | Jan. 8, 1952 |
| 2,712,065 | Elbourn | June 25, 1955 |
| 2,750,456 | Waldhaver | June 12, 1956 |
| 2,762,873 | Goodrich | Sept. 11, 1956 |
| 2,840,728 | Haugk | June 24, 1958 |
| 2,873,389 | Cagle | Feb. 10, 1959 |
| 2,931,919 | Sacks | Apr. 5, 1960 |
| 2,982,868 | Emile | May 2, 1961 |

OTHER REFERENCES

"Diode Coincidence and Mixing Circuits in Digital Computers," Proc. I.R.E., May 1950.